(12) United States Patent
Campi, Jr. et al.

(10) Patent No.: US 8,513,738 B2
(45) Date of Patent: Aug. 20, 2013

(54) ESD FIELD-EFFECT TRANSISTOR AND INTEGRATED DIFFUSION RESISTOR

(75) Inventors: John B. Campi, Jr., Westford, VT (US); Shunhua T. Chang, South Burlington, VT (US); Kiran V. Chatty, Oviedo, FL (US); Robert J. Gauthier, Jr., Hinesburg, VT (US); Junjun Li, Williston, VT (US); Rahul Mishra, Essex Junction, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 13/188,094

(22) Filed: Jul. 21, 2011

(65) Prior Publication Data

US 2013/0020645 A1    Jan. 24, 2013

(51) Int. Cl.
*H01L 23/60* (2006.01)
(52) U.S. Cl.
USPC ........... 257/358; 438/286; 438/305; 438/179; 257/E29.012; 257/E29.279; 257/E21.619; 257/363; 257/408
(58) Field of Classification Search
USPC .......... 257/358, 363, 408, E29.012, E29.279, 257/E21.619; 438/179, 286, 305, FOR. 190
See application file for complete search history.

(56) References Cited

U.S. PATENT DOCUMENTS

| | | | |
|---|---|---|---|
| 5,262,344 A | 11/1993 | Mistry | |
| 5,440,162 A | 8/1995 | Worley et al. | |
| 5,608,240 A * | 3/1997 | Kumagai | 257/204 |
| 5,640,037 A * | 6/1997 | Blanchard | 257/369 |
| 5,742,083 A | 4/1998 | Lin | |
| 5,804,860 A | 9/1998 | Amerasekera | |
| 6,027,964 A * | 2/2000 | Gardner et al. | 438/238 |
| 6,121,090 A | 9/2000 | Wu | |
| 6,140,682 A | 10/2000 | Liu et al. | |
| 6,316,805 B1 * | 11/2001 | Lin et al. | 257/328 |
| 6,611,025 B2 | 8/2003 | Lin | |
| 6,927,458 B2 | 8/2005 | Worley | |
| 7,166,904 B2 | 1/2007 | Gill et al. | |
| 7,317,228 B2 | 1/2008 | Chen | |
| 7,557,413 B2 | 7/2009 | Chen | |
| 7,646,063 B1 | 1/2010 | Boyd et al. | |

(Continued)

OTHER PUBLICATIONS

B. Keppens et al., "Active-Area-Segmentation (AAS) Technique for Compact, ESD Robust, Fully Silicided NMOS Design," Electrical Overstress/Electrostatic Discharge Symposium, EOS/ESD '03, 2003, 9 pages.

(Continued)

*Primary Examiner* — George Fourson, III
(74) *Attorney, Agent, or Firm* — Wood, Herron & Evans LLP; Anthony J. Canale

(57) ABSTRACT

An electrostatic discharge protection device, methods of fabricating an electrostatic discharge protection device, and design structures for an electrostatic discharge protection device. A drain of a first field-effect transistor and a diffusion resistor of higher electrical resistance may be formed as different portions of a doped region. The diffusion resistor, which is directly coupled with the drain of the first field-effect transistor, may be defined using an isolation region of dielectric material disposed in the doped region and selective silicide formation. The electrostatic discharge protection device may also include a second field-effect transistor having a drain as a portion the doped region that is directly coupled with the diffusion resistor and indirectly coupled by the diffusion resistor with the drain of the first field-effect transistor.

26 Claims, 12 Drawing Sheets

(56) References Cited

U.S. PATENT DOCUMENTS

| | | |
|---|---|---|
| 2005/0275028 A1 | 12/2005 | Steinhoff |
| 2007/0262305 A1 | 11/2007 | Adkisson et al. |
| 2009/0280614 A1* | 11/2009 | Chen et al. .................... 438/305 |
| 2010/0109059 A1* | 5/2010 | Nakamura .................... 257/290 |
| 2010/0167483 A1* | 7/2010 | Rouh ............................ 438/289 |
| 2012/0032254 A1* | 2/2012 | Yang et al. .................... 257/328 |
| 2012/0146158 A1* | 6/2012 | Botula et al. .................. 257/408 |

OTHER PUBLICATIONS

E. R. Worley, "New ballasting method for MOS output drivers and power bus clamps," Proceedings. 43rd Annual IEEE International Reliability Physics Symposium, 2005, pp. 458-461.

* cited by examiner

ESD FIELD-EFFECT TRANSISTOR AND INTEGRATED DIFFUSION RESISTOR

BACKGROUND

The present invention relates generally to semiconductor device fabrication and, more particularly, to electrostatic discharge (ESD) devices for protecting an integrated circuit, methods of fabricating an ESD protection device, and design structures for an ESD protection device.

Modern electronics achieve high levels of functionality in small form factors by integrating multiple functions onto a single chip. A common fabrication process that allows high levels of integration at a relatively low cost is complementary metal-oxide-semiconductor (CMOS). CMOS processes build a combination of p-type and n-type metal-oxide-semiconductor field-effect transistors (MOSFETs) to implement logic gates and other types of digital circuits, as well as analog circuits.

Chips may be exposed to ESD events leading to potentially large and damaging currents within the integrated circuit. Increasing integration densities and performance demands on CMOS chips have resulted in reduced device dimensions, which has increased the susceptibility of integrated circuits to ESD events. Manufacturers, assemblers, and users of integrated circuits must take precautions to avoid unintentionally causing ESD events. For example, ESD prevention can be incorporated into the integrated circuit and may include special design techniques for I/O pins and pads, as well as supply pads, to prevent damage to the chip during handling between the time that the chip is manufactured until the time that the chip is installed on a circuit board and while the chip is installed on the circuit board. ESD protection circuits typically function by directing the current of an ESD event away from the internal circuits of the chip.

Because the performance demands on ESD circuits have increased as CMOS device dimensions have become smaller, ESD circuits have not enjoyed the same reductions in required chip area as other types of CMOS circuits. The increase in the relative area of ESD protection circuits with respect to the protected circuits has resulted in ESD protection circuits typically requiring a larger percentage of overall chip area as CMOS device dimensions have been reduced.

Therefore, improved ESD protection devices, methods of fabricating ESD protection devices, and design structures for ESD protection devices are needed for protecting integrated circuits against ESD events.

BRIEF SUMMARY

In an embodiment of the invention, a device structure is provided for protecting an integrated circuit from an electrostatic discharge event. The device structure includes a device region comprised of a semiconductor material having a first conductivity type, a first field-effect transistor including a drain comprised of a first portion of a first doped region in the device region. The first doped region has a second conductivity type opposite to the first conductivity type. The device structure further includes a diffusion resistor comprised of a second portion of the first doped region that defines a body having a higher electrical resistance than the first portion of the first doped region. The drain of the first field-effect transistor is directly coupled with the body of the diffusion resistor.

In an embodiment of the invention, a method is provided for fabricating a device structure for protecting an integrated circuit from an electrostatic discharge event. The method includes forming a device region comprised of a semiconductor material having a first conductivity type. The method further includes forming a first doped region in the device region that has a second conductivity type opposite to the first conductivity type and that includes a drain of a first field-effect transistor as a first portion and a body of a diffusion resistor as a second portion. The body of the diffusion resistor is directly coupled with the drain of the first field-effect transistor and has a higher electrical resistance than the drain of the first field-effect transistor.

In an embodiment of the invention, a hardware description language (HDL) design structure is encoded on a machine-readable data storage medium. The HDL design structure comprises elements that, when processed in a computer-aided design system, generates a machine-executable representation of a circuit for protecting an integrated circuit during an electrostatic discharge (ESD) event. The HDL design structure includes a device region comprised of a semiconductor material having a first conductivity type and a field-effect transistor including a drain comprised of a first portion of a doped region in the device region. The doped region has a second conductivity type opposite to the first conductivity type. The HDL design structure further includes a diffusion resistor comprised of a second portion of the doped region that defines a body having a higher electrical resistance than the first portion of the doped region. The drain of the field-effect transistor is directly coupled with the body of the diffusion resistor. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with the general description of the invention given above and the detailed description of the embodiments given below, serve to explain the embodiments of the invention.

DETAILED DESCRIPTION

Figure 1:
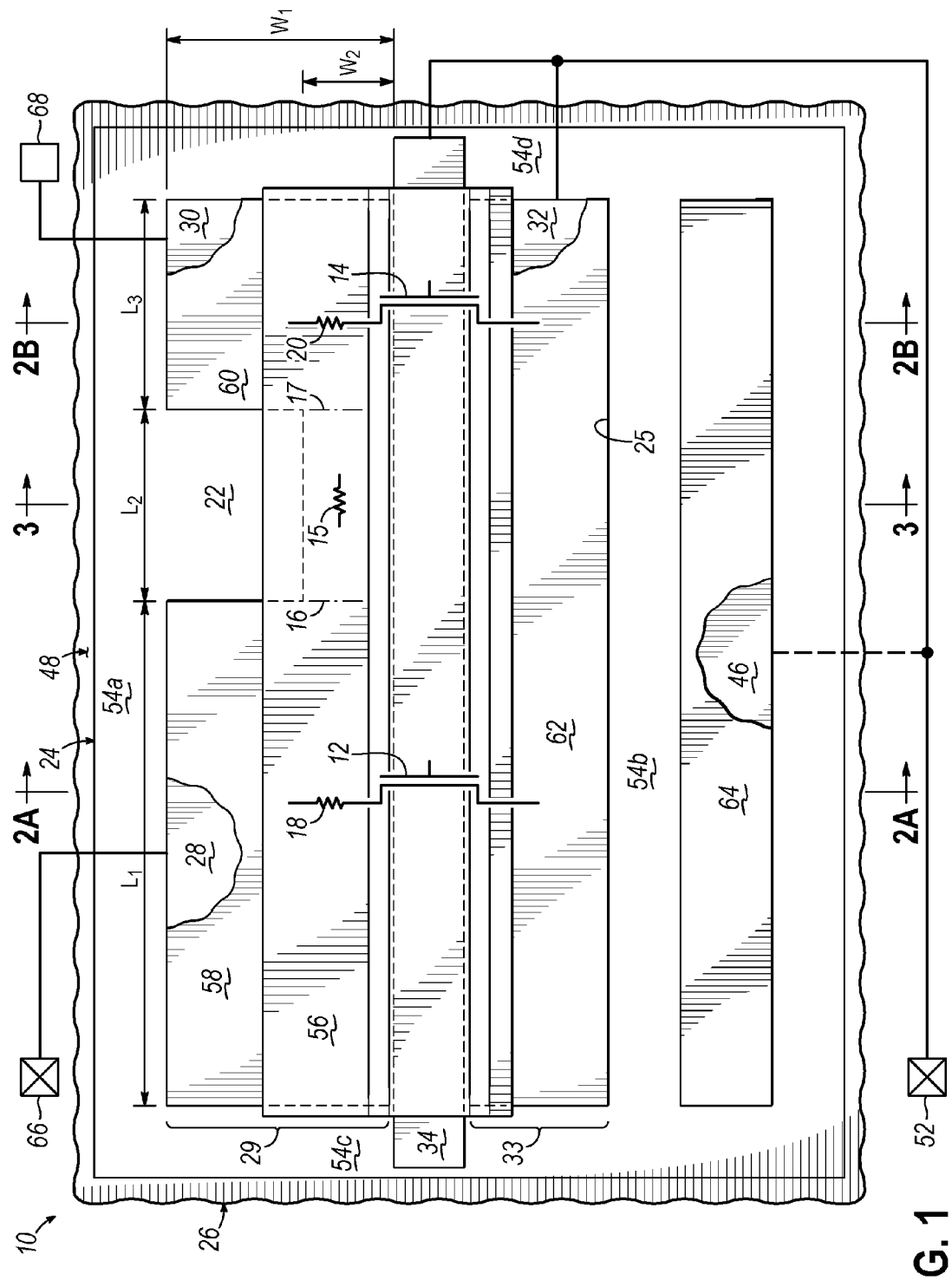
FIG. 1 is a diagrammatic top view of an ESD protection device structure in accordance with an embodiment of the invention.

Embodiments of the invention are generally directed to an electrostatic discharge (ESD) protection device for an input/output (I/O) pad of an integrated circuit or semiconductor chip. The protection device includes a first field-effect transistor and a diffusion resistor that serves as a charged device model (CDM) resistor and that is directly coupled with the drain of the first field-effect transistor. The drain of the first field-effect transistor is coupled with the I/O pad so that the first field-effect transistor serves as a primary ESD device. A second integrated field-effect transistor or an additional external device may serve as a secondary ESD device. A drain of the second field-effect transistor may be formed in the device region and may be directly coupled with an end of the diffusion resistor that is lengthwise opposite to an end directly coupled with the drain of the first field-effect transistor. As a result, the drain of the second field-effect transistor may be indirectly coupled by the diffusion resistor with the drain of the first field-effect transistor.

During an ESD event, the primary and secondary ESD devices cooperate to shunt current from the I/O pad to a power pad. The current shunted to the power pad by the secondary ESD device may pass through the diffusion resistor, causing a voltage drop across the diffusion resistor that provides additional ESD protection to the protected circuit. By integrating the CDM resistor into a doped region also forming the drain of the first field-effect transistor, contact regions for a conventional CDM resistor may be avoided. The ESD protection device may thereby provide equivalent or improved ESD protection in a more compact area as compared with conventional ESD protection circuits employing discrete CDM resistors.

With reference to FIGS. 1-4 in which like reference numerals refer to like features and in accordance with an embodiment of the invention, an ESD protection device 10 includes a field-effect transistor 12, a field-effect transistor 14, an integrated diffusion resistor 15 functioning as a charged device model (CDM) resistor, and an isolation region 22 formed in a device region 24 of a substrate 26. The substrate 26 may be a semiconductor-on-insulator (SOI) or bulk substrate comprised of a lightly-doped semiconductor material, such as p⁻ or n⁻ silicon, and is preferably monocrystalline or single-crystal material. Prior to fabrication of field-effect transistors 12, 14, a dopant may be selectively introduced into the substrate 26 using known methods to adjust the conductivity type of the device region 24 and/or to form a well in which the field-effect transistors 12, 14 and the integrated diffusion resistor 15 are formed.

The field-effect transistor 12 includes a drain 28 defined by a portion of a doped region 29, and the field-effect transistor 14 includes a drain 30 defined by another portion of the doped region 29. The drain 28 of the field-effect transistor 12 may be laterally separated from the drain 30 of the field-effect transistor 14 partially by the isolation region 22 and partially by the integrated diffusion resistor 15. The drain 28 of the field-effect transistor 12 may include a ballast resistor 18 defined by a portion of the doped region 29, and the drain 30 of field-effect transistor 14 may include a ballast resistor 20 defined by another portion of the doped region 29. Ballast resistor 18 may thereby be integral and directly coupled with the drain 28 of field-effect transistor 12. Ballast resistor 20 may thereby be integral and directly coupled with the drain 30 of the field-effect transistor 14.

The field-effect transistors 12, 14 may share a common source 32 that is formed by a doped region 33. The field-effect transistors 12, 14 may also share a common gate 34. The gate 34 may be comprised of a conductive material, such as doped polycrystalline silicon and/or a metal, and is electrically isolated from the top surface 48 of the device region 24 by an intervening gate dielectric layer 36. Spacers 38 may be formed on the sidewalls of the gate 34.

The doped regions 29, 33, which have a conductivity type opposite to that of the device region 24, are disposed laterally on opposite sides of the gate 34. The doped regions 29, 33 may be physically connected by a channel 40 located generally below the gate 34 and comprised of semiconductor material having the same conductivity type as the device region 24—i.e., a conductivity type opposite to the conductivity type of the doped regions 29, 33.

Figure 2A:
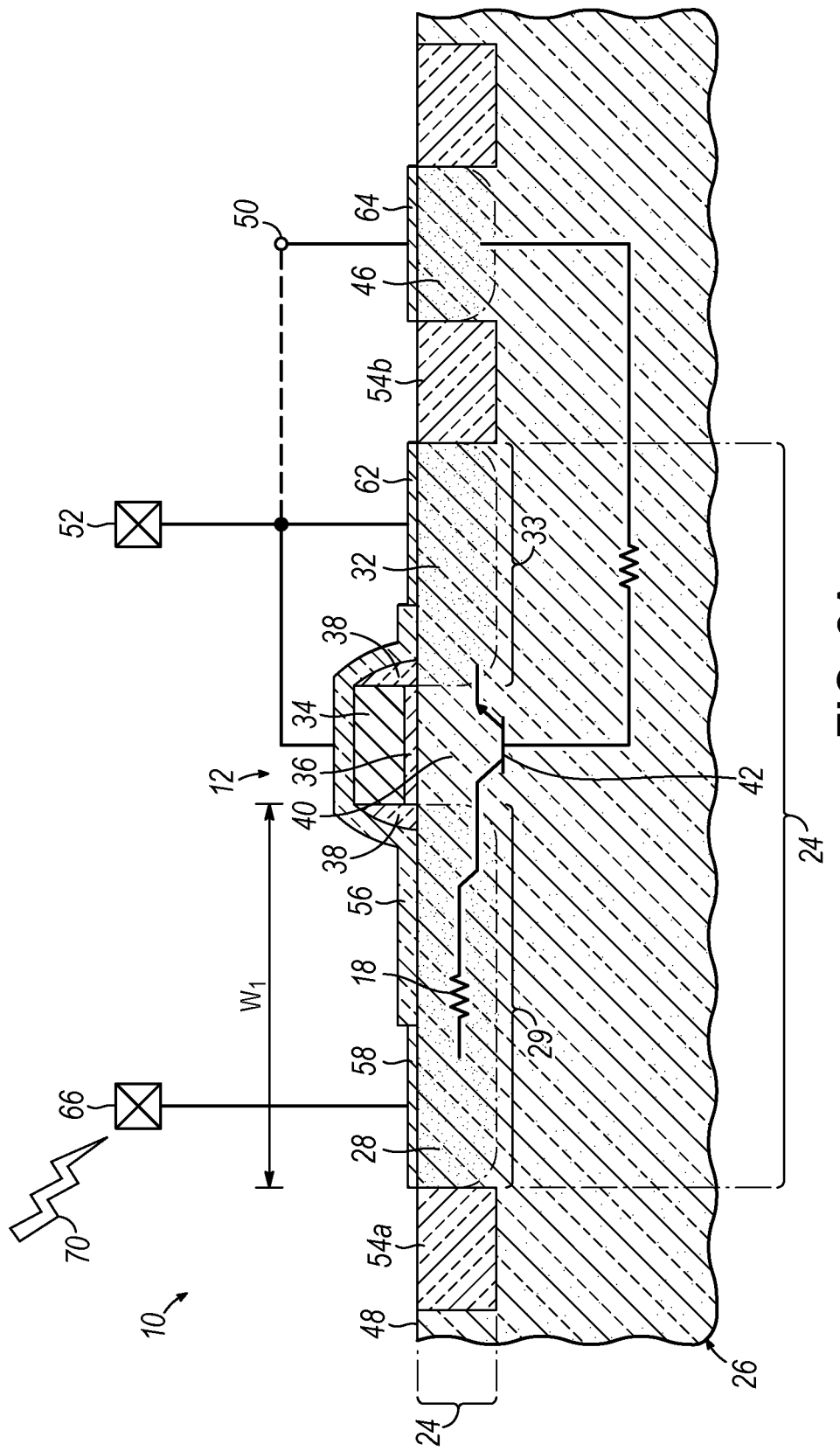
FIG. 2A is a cross sectional view of the device structure taken generally along line 2A-2A in FIG. 1 and showing a first n-channel field-effect transistor of the ESD protection device structure.
Figure 2B:
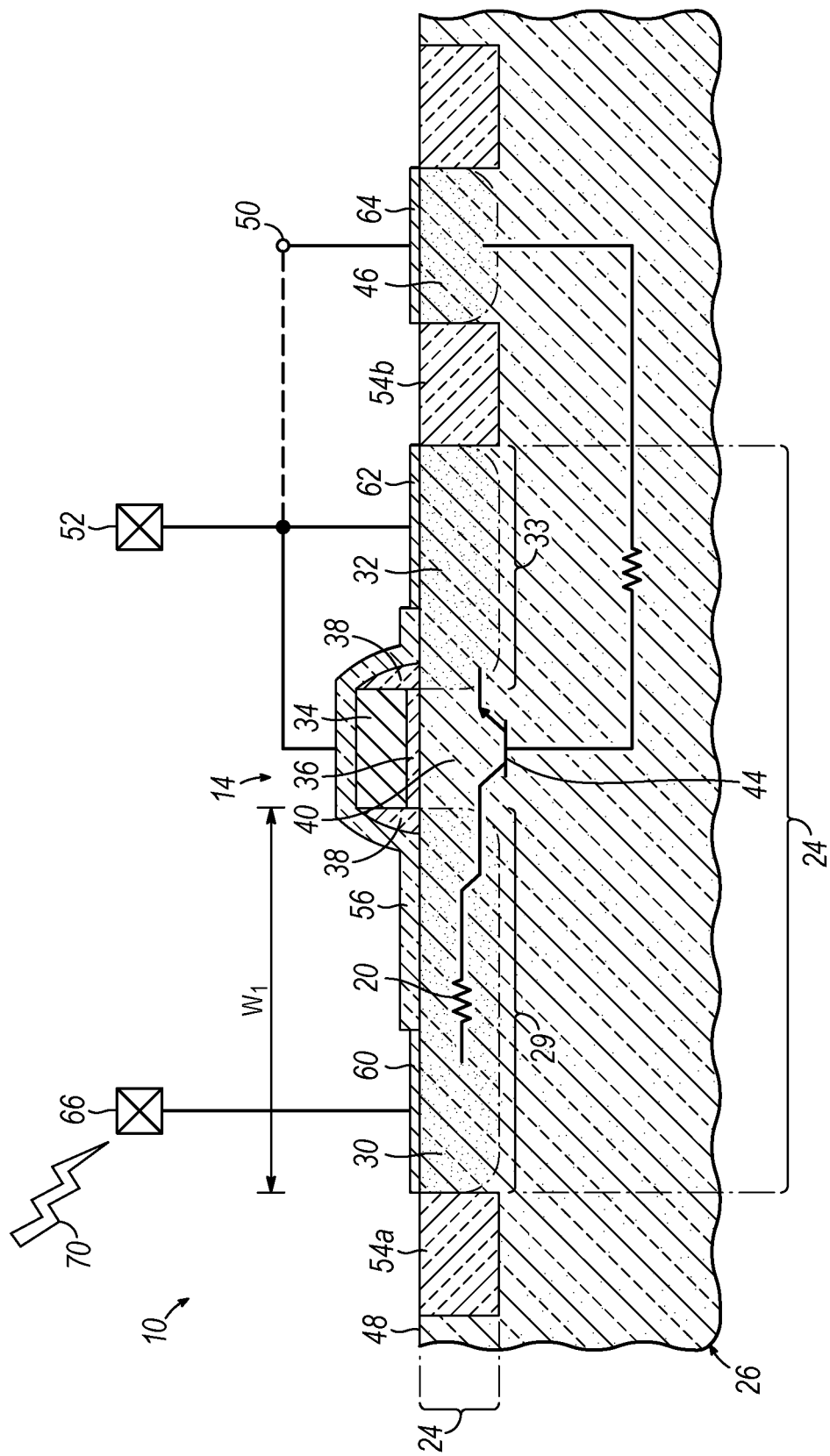
FIG. 2B is a cross sectional view of the device structure taken generally along line 2B-2B in FIG. 1 and showing a second n-channel field-effect transistor of the ESD protection device structure.

As best shown in FIGS. 2A and 2B, the drain 28, channel 40, and the source 32 of field-effect transistor 12 may define a parasitic bipolar transistor 42 (FIG. 2A) having a collector formed by the drain 28, a base formed by the channel 40, and an emitter formed by the source 32. Likewise, the drain 30, the channel 40, and the source 32 of field-effect transistor 14 may define a parasitic bipolar transistor 44 (FIG. 2B) having a collector formed by the drain 30, a base formed by the channel 40, and an emitter formed by the source 32. In the representative embodiment illustrated in FIGS. 2A and 2B, the field-effect transistors 12, 14 may be n-channel field-effect transistors (NFETs), in which instance the drains 28, 30 and source 32 of the field-effect transistors 12, 14 may be n-type semiconductor material and the device region 24 and channel 40 may be p-type semiconductor material. In this representative embodiment, the resulting structures forming parasitic bipolar transistors 42, 44 may thereby have a lateral NPN configuration. However, it is understood that the field-effect transistors 12, 14 may also be p-channel field-effect transistors (PFETs), in which case the drains 28, 30 and source 32 of the field-effect transistors 12, 14 may be p-type semiconductor and the device region 24 and channel 40 may be n-type semiconductor so that the structures forming parasitic bipolar transistors 42, 44 would have a lateral PNP configuration.

A body contact 46, which is doped with the same conductivity type but at a higher level than the device region 24, couples the body of device region 24 with a body contact node 50. The body contact node 50 may be coupled with a first pad 52, which may be a voltage supply pad that provides a desired bias voltage to the substrate 26.

Figure 3:
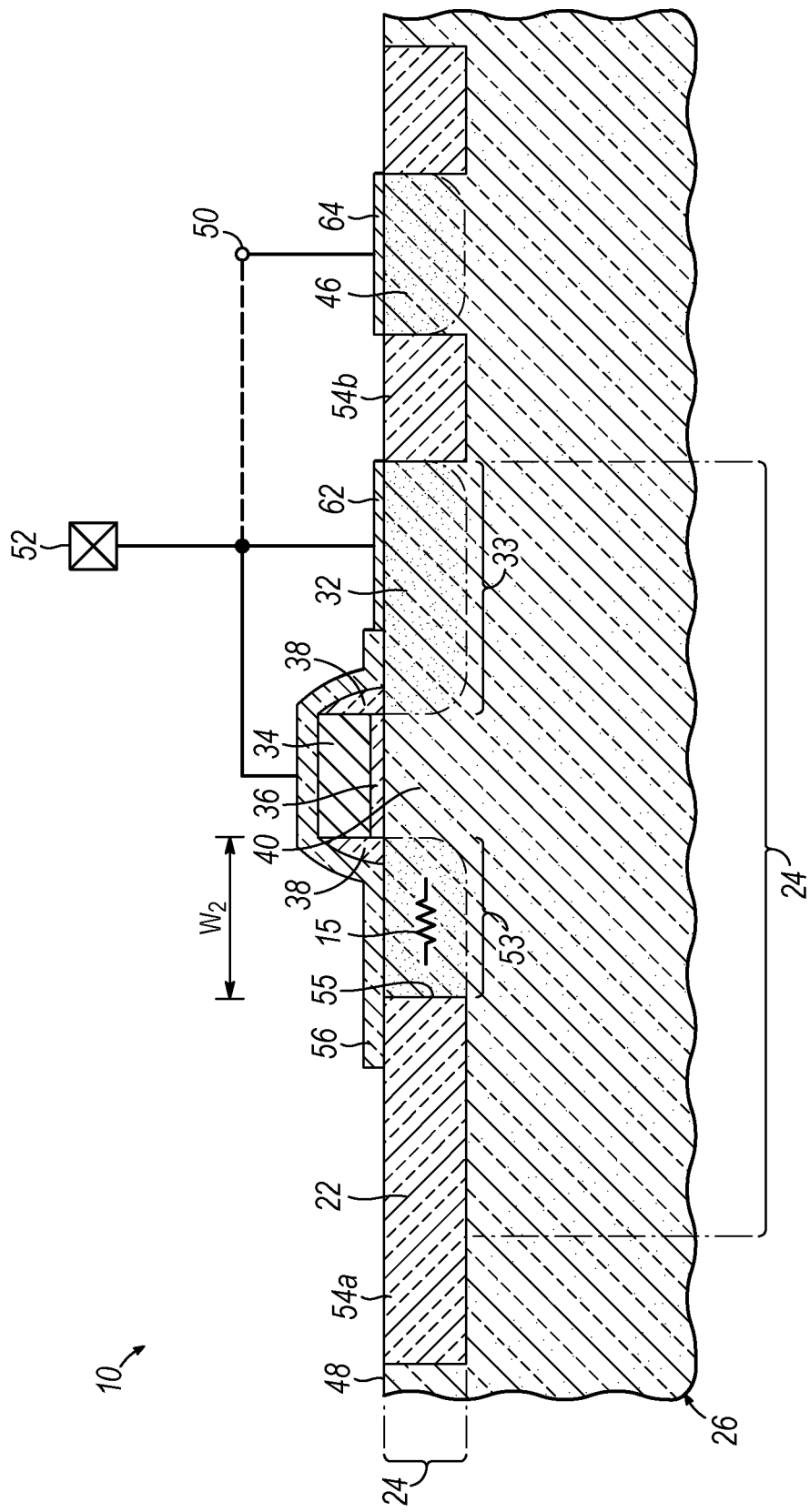
FIG. 3 is a cross sectional view of the device structure taken generally along line 3-3 in FIG. 1 and showing a diffusion resistor of the ESD protection device structure.

Dielectric regions 54a, 54b, 54c, 54d may be formed in the substrate 26 and collectively define an isolation region to laterally isolate the ESD protection device 10 from surrounding device structures (not shown) as well as from the body contact 46. The isolation region 22, which is also formed in the substrate 26, laterally isolates the drains 28, 30 of the field-effect transistors 12, 14, as best shown in FIGS. 1 and 3. To this end, the isolation region 22 may project laterally inward from an inner perimeter 25 of the isolation structure and, specifically, inward from the inner perimeter 25 of dielectric region 54a toward the channel 40 of the field-effect transistors 12, 14. In the representative embodiment, the isolation region 22 is located along the length of dielectric region 54a displaced from the opposite ends that intersect dielectric region 54c, 54d. Generally, the isolation region 22 is located along the length of dielectric region 54a from the end that intersects dielectric region 54c for defining the different cross-sectional areas of drain 28 and body 53. The isolation region 22 may have a vertical dimension sufficient to extend to a depth in the doped region 29 that defines a body 53 of the integrated diffusion resistor 15 and the drains 28, 30 as portions of the doped region 29. The body 53 may have a first vertical boundary defined at a vertical surface 55 of the isolation region 22 and a second vertical boundary defined at the channel 40.

The body 53 of the integrated diffusion resistor 15 couples the drain 28 of field-effect transistor 12 with the drain 30 of field-effect transistor 14 so that a current path connects the drains 28, 30 through the body 53. The integrated diffusion resistor 15 may thereby be formed as a portion of the doped region 29 and has a resistance related to the width, length, and thickness of the body 53 as well as the conductivity of the doped semiconductor material of the doped region 29. The body 53 is comprised of semiconductor material of the same conductivity type as the drains 28, 30 and of the opposite conductivity type as the device region 24.

The isolation region 22 and the dielectric regions 54a-54d may be formed by a shallow trench isolation (STI) technique. In one embodiment, the STI technique relies on a lithography and dry etching process to define closed-bottomed trenches in substrate 26, fills the trenches with dielectric material, and planarizes the dielectric material to the top surface 48 of the substrate 26 using a chemical mechanical polishing (CMP) process. The dielectric material may be an oxide, such as densified tetraethylorthosilicate (TEOS) deposited by thermal chemical vapor deposition (THCVD) or a high-density plasma (HDP) oxide deposited with plasma assistance.

The body 53 of the integrated diffusion resistor 15 is positioned in the doped region 29 laterally between the isolation region 22 and channel 40 of the field-effect transistors 12, 14. One end 16 of the body 53 is directly coupled with the drain 28 of field-effect transistor 12 and an opposite end 17 of the body 53 is directly coupled with the drain 30 of field-effect transistor 14. The integrated diffusion resistor 15 may thereby couple the drain 28 of field-effect transistor 12 with the drain 30 of field-effect transistor 14. The integrated diffusion resistor 15 may thereby be formed from the same doped region 29 from which the drains 28, 30 are formed. Specifically, the body 53 and the drains 28, 30 are integrally formed from a single-piece of doped semiconductor material constituting the doped region 29.

The electrical resistivity of the integrated diffusion resistor 15 may be adjusted by selecting the dimensions of the isolation region 22, which sets the dimensions (i.e., the length, $L_2$, between ends 16, 17 and the width, $W_2$) of the body 53. Because the diffusion resistor 15 and drains 28, 30 are comprised of different portions of the doped region 29, the dimension relative to the top surface 48 is the same for the integrated diffusion resistor 15 and drains 28, 30. The drains 28, 30 each have the same width, $W_1$, which is larger than the width, $W_2$, of the body 53. The drains 28, 30 have respective lengths, $L_1$, $L_3$. In the representative embodiment, the length, $L_1$, of drain 28 is greater than the length, $L_3$, of the body 53 and the length, $L_2$, of drain 30 is approximately equal to the length, $L_3$, of the body 53. When these lengths, $L_1$, $L_3$ are summed with the length, $L_2$, of the body 53, the aggregate length is equal to the length of the doped region 29. The body 53 of the diffusion resistor 15 and drains 28, 30 are serially arranged along the length of the doped region 29. The isolation region 22 functions to reduce the cross-sectional area of the doped region 29 at a position between the drain 28 of first field-effect transistor and the drain 30 of the second field-effect transistor that coincides with the location of the body 53. The reduction in cross-sectional area contributes to a locally increased resistance for the body 53 in comparison with the drains 28, 30.

To prevent silicide from being formed in undesired areas of the ESD protection device 10, a silicide blocking layer 56 may be formed by blanket deposition of a suitable material, such as silicon oxide or silicon nitride, followed by photolithography and etching steps. Silicide layers 58, 60, 62, 64 may then be formed to provide good ohmic contacts and lower the sheet resistance of the drains 28, 30 and the common source 32 of the field-effect transistors 12, 14, as well as the body contact 46. The silicide layers 58, 60, 62, 64 may be formed by depositing Titanium (Ti), Cobalt, (Co), Nickel (Ni), Tungsten (W), Platinum (Pt), or any other suitable metal for forming a silicide on the top surface 48 of substrate 26, followed by annealing and etching steps. Silicide layers 58, 60, 62, 64 may thereby be formed on selected areas of the substrate 26, with silicide layer 58 forming on the exposed surface of the drain 28 of field-effect transistor 12, silicide layer 60 forming on the exposed surface of the drain 30 of field-effect transistor 14, silicide layer 62 forming on the exposed surface of the common source 32 of field-effect transistors 12, 14, and silicide layer 64 forming on the exposed surface of body contact 46.

The silicide blocking layer 56 may be configured to prevent formation of silicide on surface areas of the device region 24 of substrate 26 that include the gate 34 and areas laterally adjacent to the gate 34, which localizes the silicide layers 58, 60, 62, 64. The silicide blocking layer 56 may thereby prevent silicide from electrically shorting the drains 28, 30 to the gate 34 and the common source 32 of field-effect transistors 12, 14. The silicide blocking layer 56 may also prevent silicide from forming on and lowering the sheet resistance of the areas of doped region 29 forming the integrated diffusion resistor 15 and the ballast resistors 18, 20. To this end, the width of silicide blocking layer 56 between the silicide layer 58 and the gate 34 prevents silicide from forming at a lateral position on the top surface 48 in vertical alignment with the ballast resistor 18. Likewise, the width of silicide blocking layer 56 between the silicide layer 60 and the gate 34 prevents silicide from forming at a lateral position on the top surface 48 in vertical alignment with the ballast resistor 20. The ballast resistor 18 may thereby comprise a portion of the doped region 29 between the drain 28 and the channel 40 of field-effect transistor 12. Similarly, the ballast resistor 20 may comprise a portion of the doped region 29 between the drain 30 and the channel 40 of field-effect transistor 14. The width of the ballast resistors 18, 20 may thereby be defined by the lateral dimensions of the silicide blocking layer 56, thereby providing designers with a mechanism for adjusting the resistance of ballast resistors 18, 20.

The electrical resistance of the body 53 is proportional to the resistivity coefficient of the semiconductor material of the doped region 29, the length of the body 53, and the cross-sectional area of the body 53. The dimensions of the drains 28, 30 and the body 53 are selected such that the body 53 has a higher electrical resistance than either of the drains 28, 30. In the representative embodiment, the drains 28, 30 and the body 53 each have a uniform cross-sectional area, but the cross-sectional area of drains 28, 30 is larger than the cross-sectional area of body 53. Because the drains 28, 30 and body 53 constitute portions of the shared doped region 29, the reduced cross section and the absence of silicide on surface 48 across a surface area overlying the portion of the doped region 29 constituting body 53 cause the body 53 to have a higher electrical resistivity than either of the drains 28, 30. These mutual relationships may also be equivalently expressed in terms of sheet resistance.

Figure 4:
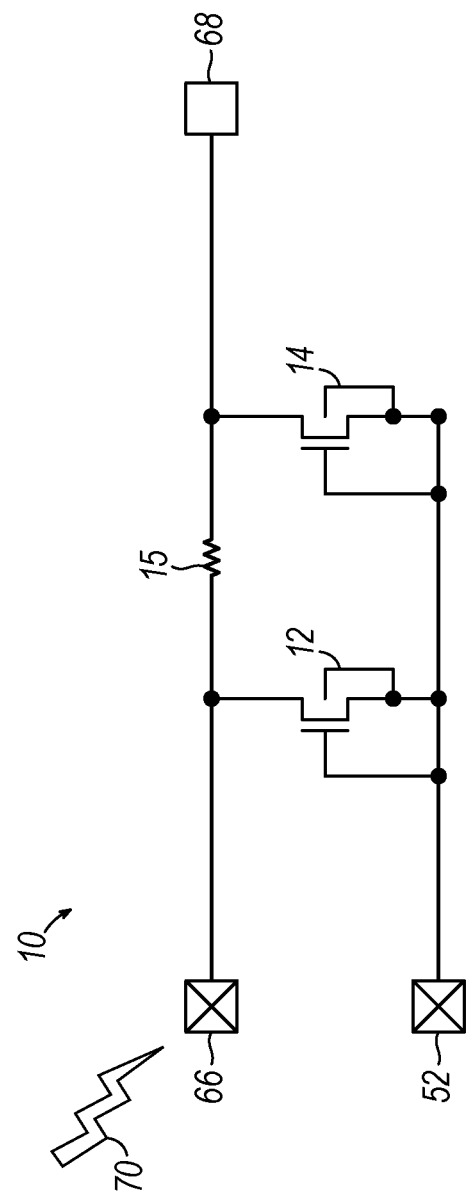
FIG. 4 is a schematic view of an electrical circuit provided by the ESD protection device structure in FIGS. 1-3.

The ESD protection device 10 may couple a second pad 66, which may be an input/output (I/O) pad, with a protected internal circuit 68, which may be an internal circuit fabricated on the same semiconductor chip as the ESD protection device 10. More specifically, the second pad 66 may be coupled with an input receiver gate of the protected internal circuit 68. To this end, the drain 28 of the field-effect transistor 12 may be coupled with the second pad 66 and the drain 30 of the field-effect transistor 14 may be coupled with the protected internal circuit 68. As best shown in FIG. 4, the I/O pad 66 may thereby be coupled with the protected internal circuit 68 by the integrated diffusion resistor 15.

The gate 34 of field-effect transistors 12, 14 may be electrically coupled with the source 32 of field-effect transistors 12, 14 so that the gate-to-source voltages ($V_{GS}$) of the field-effect transistors 12, 14 are at or near zero. The zero $V_{GS}$ may maintain the field-effect transistors 12, 14 in a high-impedance or off state under non-ESD conditions. The source 32 may be further electrically coupled with the first pad 52 to provide an ESD current path between the field-effect transistors 12, 14 and the first pad 52. The field-effect transistor 12 may thereby couple the second pad 66 to the first pad 52 to provide a primary ESD path between the second pad 66 and the first pad 52. Similarly, the field-effect transistor 14 may thereby couple the protected internal circuit 68 to the first pad 52 to provide a secondary ESD path between the protected internal circuit 68 and the first pad 52.

The ESD protection device 10 may be fabricated as part of a CMOS or BiCMOS chip. As understood by a person having ordinary skill in the art of semiconductor fabrication, standard CMOS or BiCMOS fabrication processes may be employed using a suitable substrate, such as a bulk semiconductor substrate or a device layer of an SOI substrate, as substrate 26. For example, the device region 24, drains 28, 30, common source 32, and body contact 46 may be formed by masking, implanting dopants of suitable impurity species with suitable kinetic energies, and thermally activating the implanted dopants. Gate structures for the field-effect transistors 12, 14 may be formed by depositing a layer stack that includes one or more insulator layers and one or more conductive layers. Photolithography and RIE may then be used to define the gate 34 and gate dielectric layer 36 from the layer stack. The doped regions forming the drains 28, 30 and common source 32 for the field-effect transistors 12, 14 may be formed by implanting a dopant such as P, As, Sb, or other suitable n-type dopant to form n-channel field-effect transistors (NFETs). In an alternative embodiment of the invention, the doped regions forming the drains 28, 30 and common source 32 of field-effect transistors 12, 14 may be formed by implanting a dopant such as B, Al, Ga, or any other suitable p-type dopant to form p-channel field-effect transistors (PFETs). The dopants may be introduced by ion implantation using the gate 34 and/or spacers 38 as a self-aligning mask and separate resist masks during n-type and p-type dopant implantations. The dopants may then be activated by an annealing step.

Standard back-end-of-line (BEOL) processing may follow the formation of the ESD protection device 10 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process may be replicated to stack multiple wiring levels so that a multi-level, high density framework of conductive interconnections is formed. Damascene processes and materials used in damascene processes are understood by a person having ordinary skill in the art.

The BEOL interconnect structure may include one or more lower dielectric layers containing metallization that supplies local interconnect wiring, and one or more upper dielectric layers containing metallization for levels of interconnect wiring. The BEOL interconnect structure may include a first wiring path electrically coupling the first pad 52 with the common source 32 of the field-effect transistors 12, 14 and a second wiring path coupling the second pad 66 with the drain 28 of field-effect transistor 12. The first wiring path may include conductive plugs (not shown) coupled with the silicide layer 62 on source 32 and the second wiring path may include conductive plugs (not shown) coupled with the silicide layer 58 on drain 28. The BEOL interconnect structure may further include a third wiring path coupling the protected internal circuit 68 to the drain 30 of field-effect transistor 14. The third wiring path may include conductive plugs (not shown) coupled with the silicide layer 60 on drain 30.

The pads 52, 66 may be fabricated using BEOL processes, such as layer deposition, photolithography and subtractive etching understood by a person having ordinary skill in the art. For example, pads 52, 66 may be fabricated by depositing a layer stack including a top layer of aluminum (Al), copper (Cu), or an alloy (e.g., AlCu) onto the topmost level of the interconnect wiring and shaping the layer stack with one or more photolithography and etching processes.

In operation and with reference to FIGS. 1, 2A, 2B, 3 and 4, a representative embodiment employing NFETs for the field-effect transistors 12, 14 may have the first pad 52 electrically coupled with a negative chip supply voltage, such as ground or $V_{SS}$, and the second pad 66 coupled with an I/O signal source. As discussed previously, because the gates of field-effect transistors 12, 14 are shorted to the common source 32, the field-effect transistors 12, 14 will typically be in an off or high impedance state. In the absence of an ESD event in a non-ESD condition, the base-collector junction of the parasitic bipolar transistor 42 formed between the drain 28 and channel 40 of field-effect transistor 12 may be reversed biased. This reverse bias may result from the negative chip supply voltage on the first pad 52 pulling the source 32 of field-effect transistor 12 below the voltage present on the second pad 66. Likewise, the base-collector junction of the parasitic bipolar transistor 44 formed between the drain 30 and channel 40 of field-effect transistor 14 may also be reversed biased. The resulting relatively high impedances of the first and second field-effect transistors may allow the voltage present on the second pad 66 to be coupled with the protected internal circuit 68 through the integrated diffusion resistor 15 relatively unaffected by the existence of the ESD protection device 10.

An ESD event 70 (FIG. 4), such as a positive voltage pulse, may cause the voltage on the second pad 66 to rise significantly relative to the first pad 52, which may increase the reverse bias voltage across the base-collector junction of the parasitic bipolar transistor 42 to the point where the base-collector junction breaks down. The breakdown of the base-collector junction may inject a large number of carriers into the channel 40 in the vicinity of field-effect transistor 12, which defines the base region of the parasitic bipolar transistor 42. The presence of these carriers in the base region of the parasitic bipolar transistor 42 may switch on transistor 42, causing the impedance between the drain 28 and the source 32 of field-effect transistor 12 to drop abruptly. This abrupt drop in impedance may provide a negative resistance transition or voltage snapback by the field-effect transistor 12 in response to the ESD event 70.

The field-effect transistor 12 may thereby provide a low impedance ESD path from the second pad 66 to the first pad 52, which may shunt at least a portion of the current of the ESD event 70 away from the second pad 66 to the first pad 52. Once the current path through the parasitic bipolar transistor 42 is established, the transistor 42 may remain in a low-impedance state until the current from the ESD event 70 drops below a minimum threshold or holding current. When the current of the ESD event 70 has dissipated, the current through the parasitic bipolar transistor 42 may drop below the holding current so that the field-effect transistor 12 reverts back to a high impedance state awaiting the occurrence of another ESD event 70.

In a similar fashion, the ESD event 70 may also increase the reverse bias voltage across the base-collector junction of the parasitic bipolar transistor 44 to the point where the base-collector junction breaks down. The breakdown of the base-collector junction may inject a large number of carriers into the channel 40 in the vicinity of field-effect transistor 14, which defines the base region of the parasitic bipolar transistor 44. The presence of these carriers may switch on the parasitic bipolar transistor 44, causing the impedance between the drain 30 and source 32 of field-effect transistor 14 to drop abruptly. As described with respect to the field-effect transistor 12, this abrupt drop in impedance may provide a negative resistance transition or voltage snapback by the field-effect transistor 14.

The field-effect transistor 14 may thereby provide a low impedance ESD path between the protected internal circuit 68 and the first pad 52, which may shunt a portion of the current of ESD event 70 away from the protected internal circuit 68. The current shunted to the first pad 52 by the field-effect transistor 14 may pass through the integrated diffusion resistor 15, so that a voltage drop develops across the integrated diffusion resistor 15. This voltage drop may reduce the ESD voltage presented to the protected internal circuit 68 as compared to an ESD device or circuit lacking the integrated diffusion resistor 15. As with the field-effect transistor 12, once the current path through the parasitic bipolar transistor 44 is established, the transistor 44 may remain in a low-impedance state until the current from the ESD event 70 drops below a minimum threshold or holding current. When the current of the ESD event 70 has dissipated, the current through the parasitic bipolar transistor 44 may drop below the holding current, so that the field-effect transistor 14 reverts back to a high impedance state awaiting the occurrence of another ESD event 70.

To permit non-destructive snapback conduction in the field-effect transistors 12, 14, ballast resistors 18, 20 may be used to increase conduction uniformity across the base-emitter junctions of the parasitic bipolar transistors 42, 44. The forward voltage drop across the base-emitter junctions of parasitic bipolar transistors 42, 44 may have a negative temperature coefficient—i.e., the forward voltage drop across the base-emitter junctions of parasitic bipolar transistors 42, 44 may be reduced as the temperature rises due to thermal generation of carriers near the junction. This reduced forward voltage drop may cause the shunted ESD currents to concentrate in areas of the base-emitter junctions of parasitic bipolar transistors 42, 44 where the temperature is highest. This current concentration may further increase the temperature in the warmest regions of the junctions, forming one or more hot spots. Thermal runaway at these hotspots and the resulting current concentration may damage the junction, thereby lowering the current handling capability of the parasitic bipolar transistors 42, 44. The ballast resistors 18, 20 may reduce this tendency to form hotspots because as the emitter current increases in a localized region near a hotspot, the voltage drop across the associated localized region of the ballast resistor 18, 20 also increases, which reduces the forward bias across the base-emitter junction at that location. The ballast resistors 18, 20 may thereby increase conduction uniformity across the base-emitter junctions of the parasitic bipolar transistors 42, 44 and increase the current handling ability of the ESD protection device 10.

The operation of a representative embodiment employing PFETs for the field-effect transistors 12, 14 is similar to that described for embodiments employing NFETs. For an ESD protection device 10 employing PFETs for the field-effect transistors 12, 14, the first pad 52 may be electrically coupled with a positive chip supply voltage, such as $V_{DD}$, and the second pad 66 may be coupled with the I/O signal source. Under non-ESD conditions, the base-collector junction of the parasitic bipolar transistor 42 formed between the drain 28 and channel 40 of field-effect transistor 12 (which may have a PNP structure) may be reversed biased. This reverse bias may result from the positive chip supply voltage on the first pad 52 driving the source 32 of field-effect transistor 12 above the voltage present on the second pad 66. Likewise, the base-collector junction of the parasitic bipolar transistor 44 formed between the drain 30 and the channel 40 of field-effect transistor 14 may also be reversed biased. The resulting high impedances of field-effect transistors 12, 14 may result in the voltage present on the second pad 66 being coupled with the protected internal circuit 68 through the integrated diffusion resistor 15 relatively unaffected by the ESD protection device 10.

An ESD event 70, such as a negative voltage pulse, may cause the voltage on the second pad 66 to drop significantly relative to the first pad 52, which may increase the reverse bias voltage across the base-collector junction of parasitic bipolar transistor 42 to the point where the base-collector junction breaks down. The breakdown of the base-collector junction may inject a large number of carriers into the channel 40 in the vicinity of field-effect transistor 12, which defines the base region of parasitic bipolar transistor 42. The presence of these carriers may cause the parasitic bipolar transistor 42 to switch on, causing the impedance between the drain 28 and source 32 of field-effect transistor 12 to drop abruptly. This abrupt drop in impedance may provide a negative resistance transition or voltage snapback by the field-effect transistor 12 in response to the ESD event 70.

The field-effect transistor 12 may thereby provide a low impedance ESD path from the second pad 66 to the first pad 52, which may shunt at least a portion of the ESD event 70 away from the second pad 66. Once the current path through the parasitic bipolar transistor 42 is established, the transistor 42 may remain in a low-impedance state until the current from the ESD event 70 drops below a minimum threshold or holding current. When the current of the ESD event 70 has dissipated, the current through the parasitic bipolar transistor 42 may drop below the holding current so that the field-effect transistor 12 reverts back to a high impedance state awaiting the occurrence of another ESD event 70.

In a similar fashion, the ESD event 70 may also increase the reverse bias voltage across the base-collector junction of the parasitic bipolar transistor 44 to the point where the base-collector junction breaks down. The breakdown of the base-collector junction may inject a large number of carriers into channel 40 in the vicinity of field-effect transistor 14, which defines the base region of the parasitic bipolar transistor 44. The presence of these carriers in the base of the parasitic bipolar transistor 44 may switch on transistor 44 causing the impedance between the drain 30 and source 32 of field-effect transistor 14 to drop abruptly. This abrupt drop in impedance may provide a negative resistance transition or voltage snapback by the field-effect transistor 14 in response to the ESD event 70.

The field-effect transistor 14 may thereby provide a low impedance ESD path between the protected internal circuit 68 and the first pad 52, which may shunt at least a portion of the current of the ESD event 70 away from the protected internal circuit 68. The current shunted away from the protected internal circuit 68 by the field-effect transistor 14 may pass through the integrated diffusion resistor 15, so that a voltage drop develops across the integrated diffusion resistor 15. This voltage drop may reduce the ESD voltage presented to the protected internal circuit 68 as compared to an ESD device lacking the integrated diffusion resistor 15. Similarly as described with respect to the field-effect transistor 12, once the current path through the parasitic bipolar transistor 44 is established, the transistor 44 may remain in a low-impedance state until the current from the ESD event 70 drops below a minimum threshold or holding current. When the ESD event 70 has dissipated, the current through the parasitic bipolar transistor 44 may drop below the holding current so that the field-effect transistor 14 reverts back to a high impedance state awaiting the occurrence of another ESD event 70.

Figure 5:
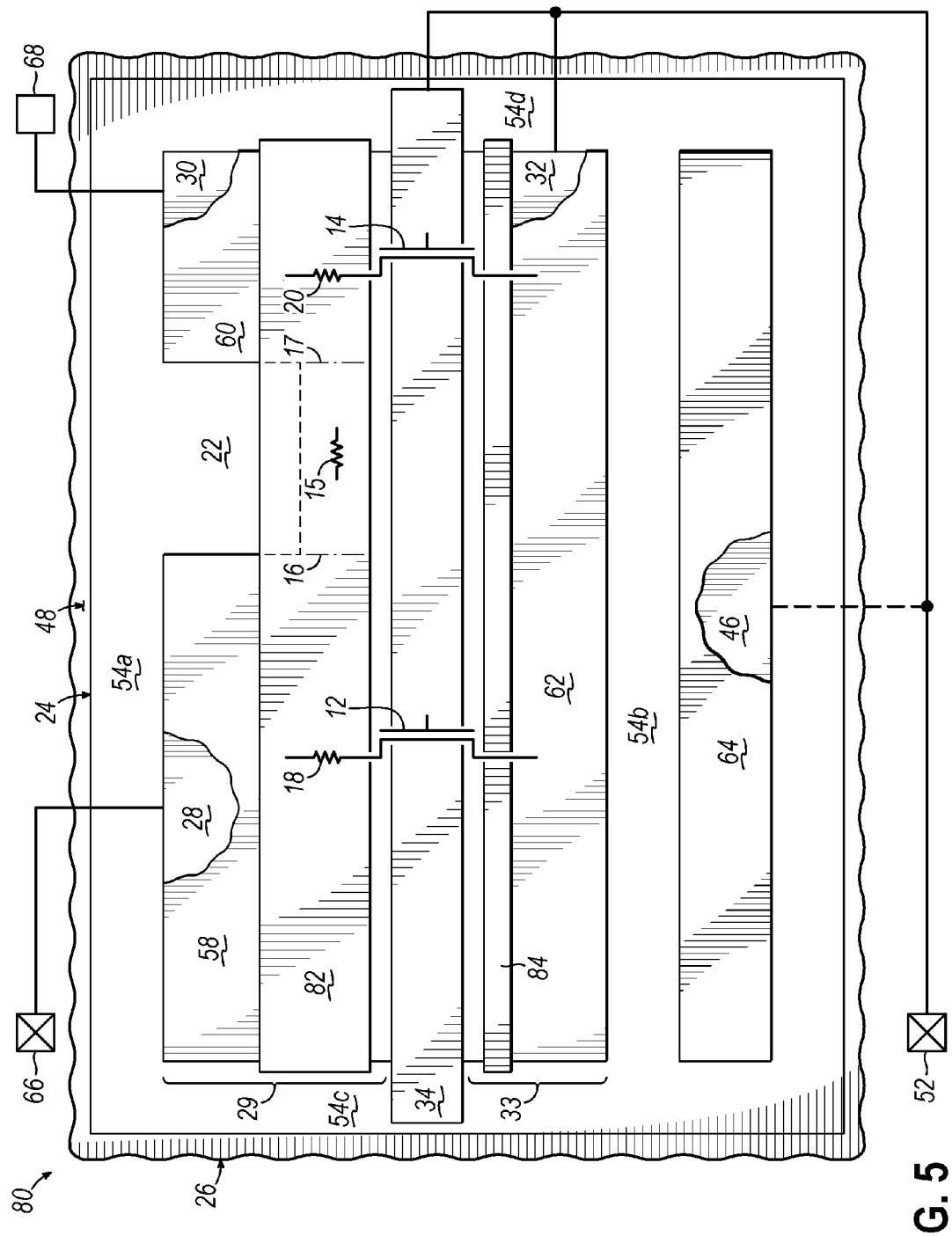
FIG. 5 is a diagrammatic top view of an ESD protection device structure in accordance with an alternative embodiment of the invention.

With reference to FIG. 5 in which like reference numerals refer to like features in FIGS. 1-4 and in accordance with an alternative embodiment of the invention, the ESD protection device 80 is similar to the ESD protection device 10 (FIGS. 1-4) except that the silicide blocking layer 56 is partitioned into a drain-side silicide blocking layer 82 and a source-side silicide blocking layer 84. The drain-side silicide blocking layer 82 prevents silicide formation on the surface areas on the top surface 48 laterally adjacent to the gate 34 and that overlie the integrated diffusion resistor 15 and ballast resistors 18, 20. The drain-side silicide blocking layer 82 may thereby maintain the sheet resistance of doped region 29 at a suitable level for surface areas overlying the integrated diffusion resistor 15 and ballast resistors 18, 20. The drain-side silicide blocking layer 82 may also prevent silicide from electrically shorting the drains 28, 30 to the gate 34 of field-effect transistors 12, 14. In a similar fashion, the source-side silicide blocking layer 84 may prevent silicide from electrically shorting the source 32 and gate 34 of field-effect transistors 12, 14. The drain-side and source-side silicide blocking layers 82, 84 may be configured to provide a lateral gap or discontinuity between the silicide blocking layers 82, 84, which exposes the gate 34 to the siliciding process. The silicide layer 58 has a portion that is formed on the gate 34, which may reduce the gate resistance of the field-effect transistors 12, 14.

Figure 6:
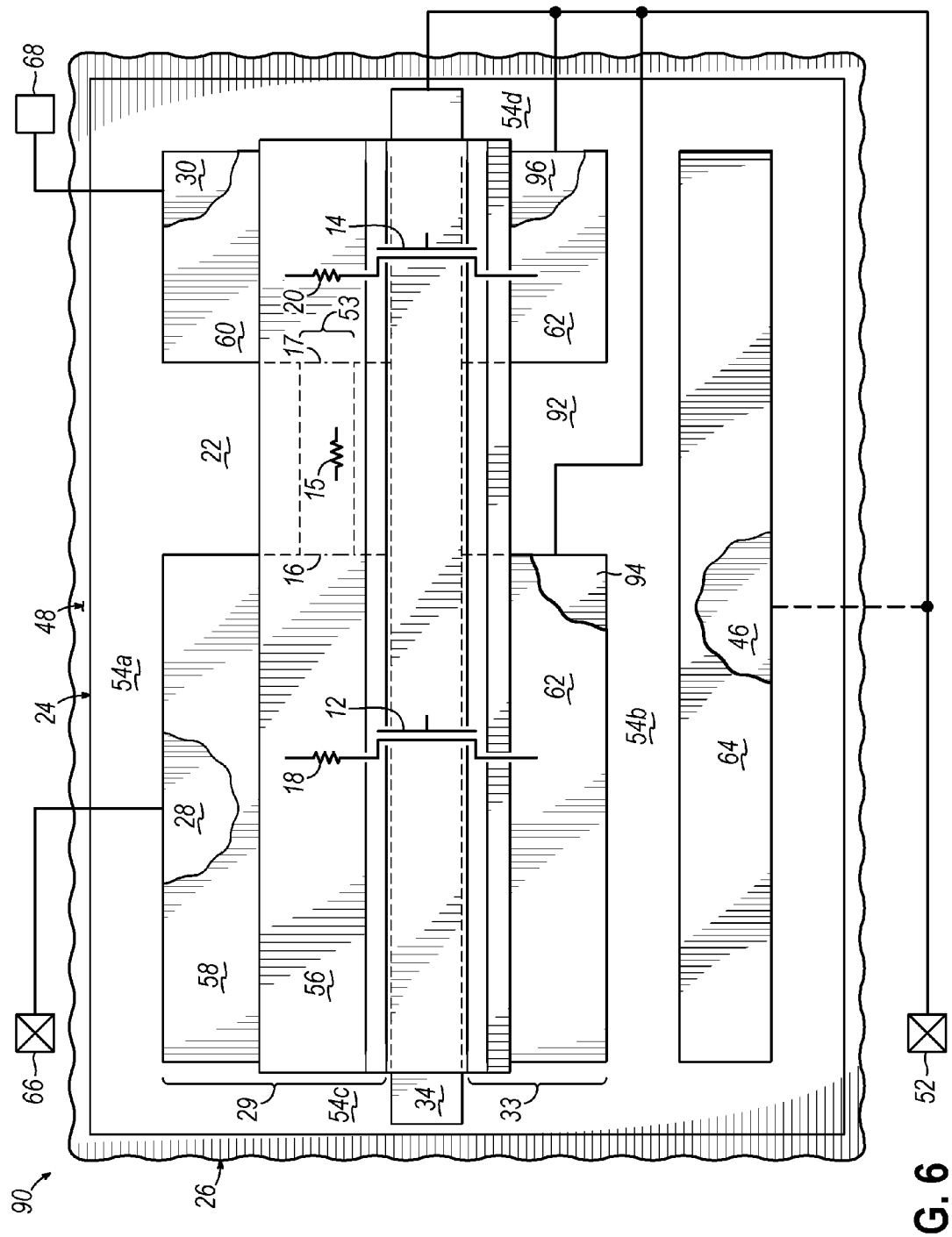
FIG. 6 is a diagrammatic top view of an ESD protection device structure in accordance with an alternative embodiment of the invention.

With reference to FIG. 6 in which like reference numerals refer to like features in FIGS. 1-4 and in accordance with an alternative embodiment of the invention, the ESD protection device 90 is similar to the ESD protection device 10 (FIGS. 1-4) except that an isolation region 92 is included in the device region 24. The isolation region 92, which may be formed by an STI technique as previously described, projects laterally from the dielectric region 54b into the doped region 33 and channel 40 of field-effect transistors 12, 14. The isolation region 92 may thereby divide the doped region 33 to define a source 94 of field-effect transistor 12 that is separate and distinct from a source 96 of field-effect transistor 14. The isolation region 92 may pass beneath the gate 34 and may be located generally opposite the isolation region 22 so that the isolation region 92 cooperates with isolation region 22 to narrow the width of the body 53 forming the integrated diffusion resistor 15. The isolation region 92 may thereby increase the isolation between the field-effect transistors 12, 14 as well as increase the isolation between the integrated diffusion resistor 15 and the channel 40 of field-effect transistors 12, 14.

Figure 7:
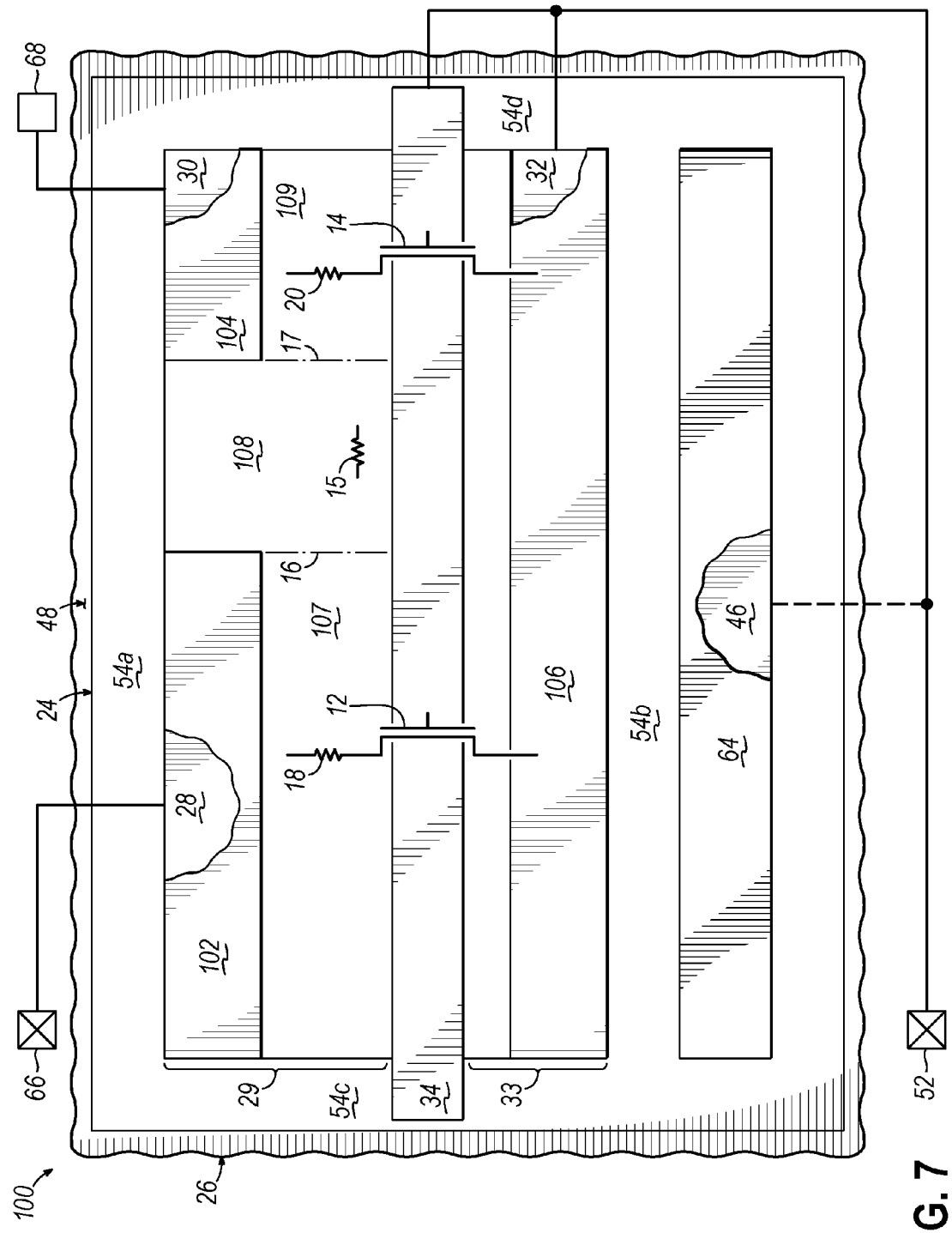
FIG. 7 is a diagrammatic top view of an ESD protection device structure in accordance with an alternative embodiment of the invention.

With reference to FIG. 7 in which like reference numerals refer to like features in FIGS. 1-4 and in accordance with an alternative embodiment of the invention, the ESD protection device 100 is similar to the ESD protection device 10 (FIGS. 1-4) except that the isolation region 22 is omitted. To confine the silicide layers 102, 104, 106 within their desired areas, silicide layers 102, 104, 106 may be formed using a trench silicide (TS) process.

The TS process may be used to provide ohmic contacts with and reduce the sheet resistance of the drain 28 of field-effect transistor 12, the drain 30 of field-effect transistor 14, and the source 32 shared by field-effect transistors 12, 14. The TS process may include formation of a patterned hardmask by blanket deposition of a hardmask material, such as silicon nitride ($Si_3N_4$), using a suitable deposition process such as chemical vapor deposition (CVD) or plasma assisted CVD. The deposition process may be followed by patterning using standard photolithographic methods to form windows or openings in the hardmask layer aligned with the intended locations of the silicide layers 102, 104, 106. The openings may expose selected surface areas on the top surface 48 of substrate 26 for forming silicide layers 102, 104, 106 on the doped regions 29, 33 as described above for silicide layers 58, 60, 62, 64 (FIGS. 1-4).

The silicide layer 102 forms a contact for the drain 28 of field-effect transistor 12 and the silicide layer 104 forms a contact for the drain 30 of field-effect transistor 14. The silicide layers 102, 104 may be configured so that an unsilicided surface area 108 of the doped region 29 is defined above the integrated diffused resistor 15 as described with respect to FIGS. 1-4. Likewise, the ballast resistor 18 may be provided beneath an unsilicided surface area 107 of doped region 29 disposed between the silicide layer 102 and the channel 40 of field-effect transistor 12. Similarly, the ballast resistor 20 may be provided beneath an unsilicided surface area 109 of doped region 29 disposed between the silicide layer 104 and the channel 40 of field-effect transistor 14. The unsilicided surface areas 107, 108, 109 are free of silicide. The integrated diffusion resistor 15 and ballast resistors 18, 20 may thereby be formed by selectively patterning the silicide layers 102, 104, 106 without forming isolation regions.

Figure 7A:
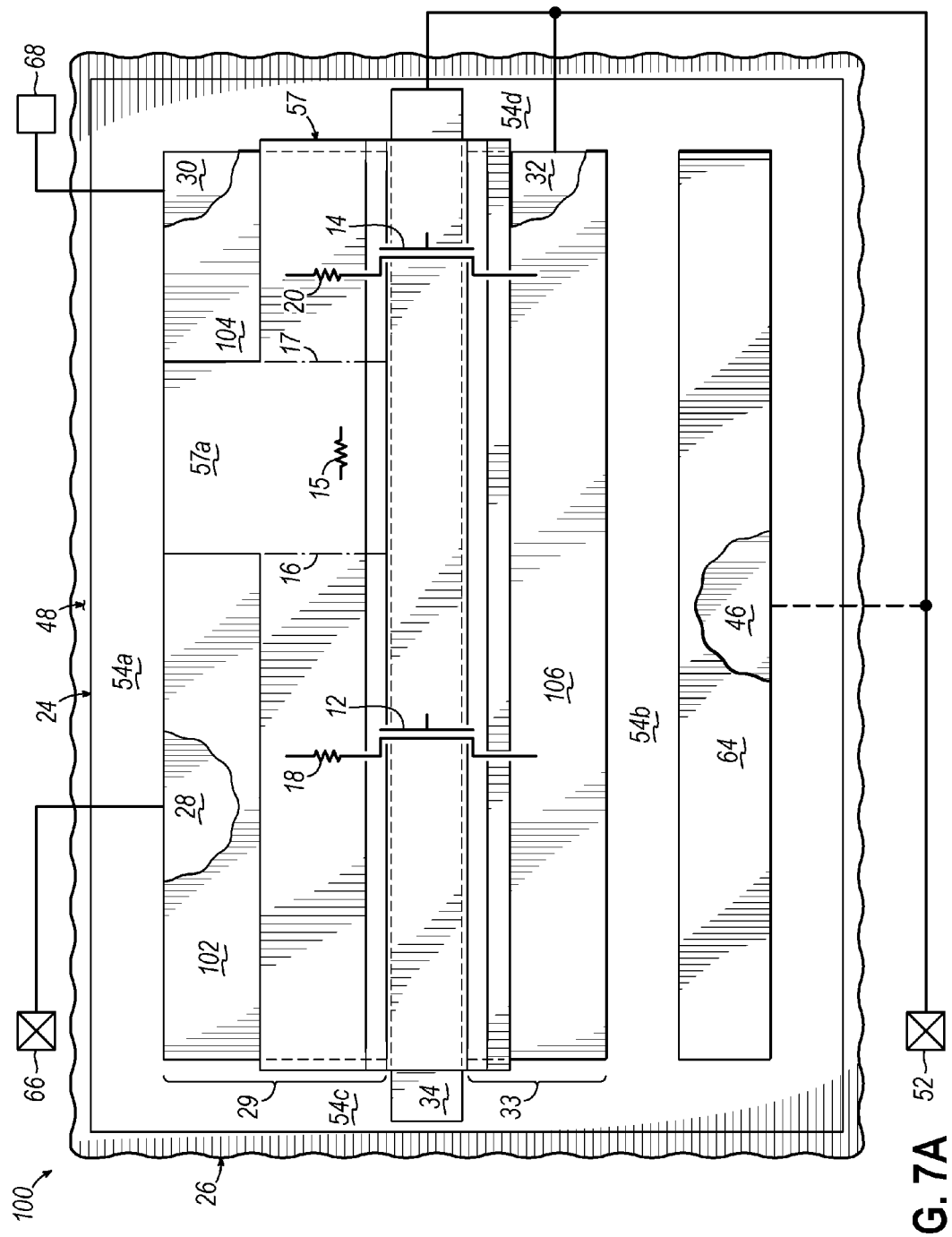
FIG. 7A is a diagrammatic top view similar to FIG. 7 of an ESD protection device structure in accordance with an alternative embodiment of the invention

In an alternative embodiment and as shown in FIG. 7A, a silicide blocking layer 57 may be formed that covers the areas 107, 108, 109, gate 34, and a portion of doped region 33 so that the gate 34 is electrically isolated from the source 32. The silicide blocking layer 57 operates as a substitute for the trench silicide process described above and functions to spatially restrict silicide layers 102, 104, 106 within their desired areas. The silicide blocking layer 57 is similar to silicide blocking layer 56 (FIGS. 1-3) but includes a portion 57a that is laterally positioned between the drains 28, 30 and their respective silicide layers 102, 104. Portion 57a projects outwardly as a finger from the remainder of silicide blocking layer 57 toward an outer perimeter of the device region 24.

Figure 8:
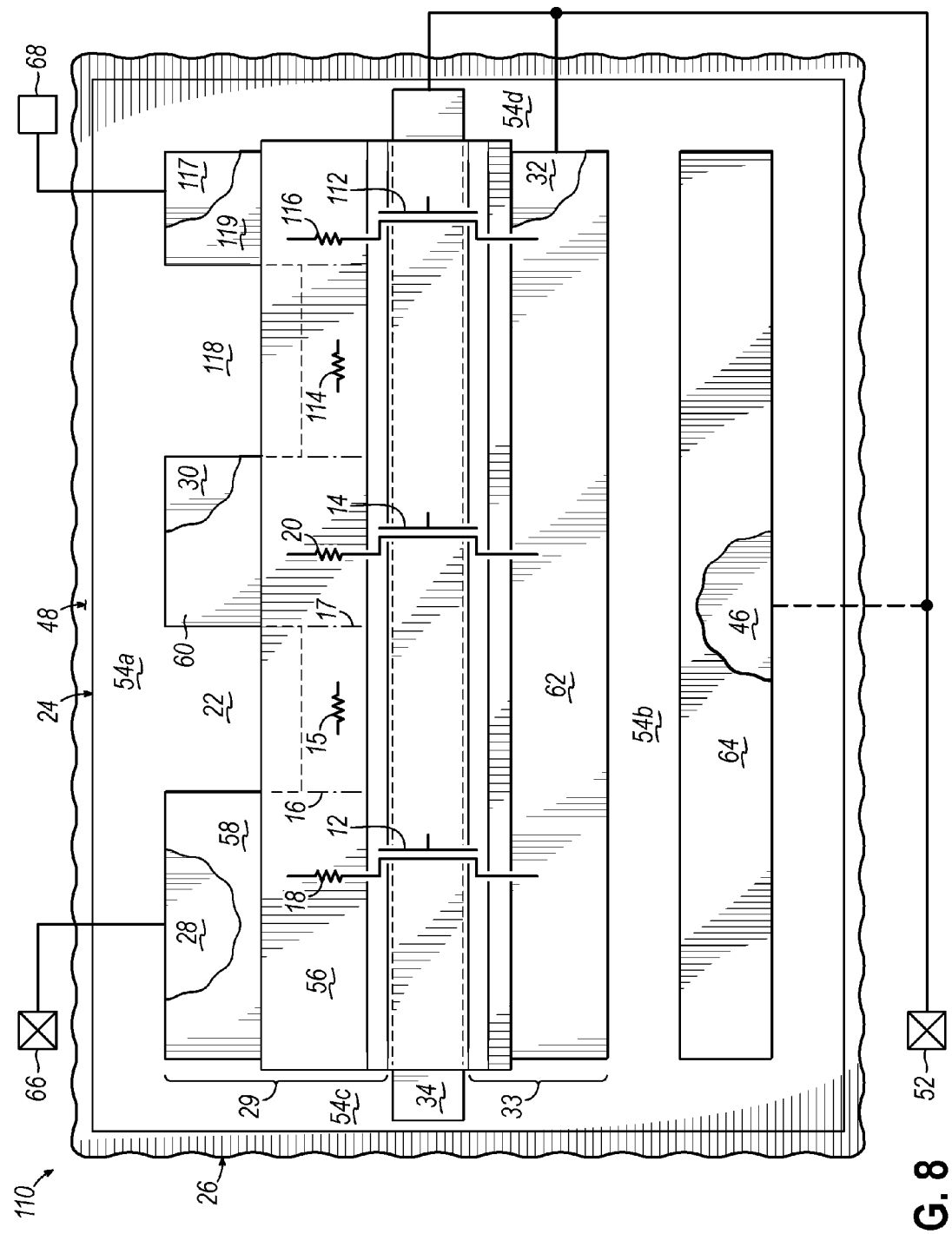
FIG. 8 is a diagrammatic top view of an ESD protection device structure in accordance with an alternative embodiment of the invention.

With reference to FIG. 8 in which like reference numerals refer to like features in FIGS. 1-4 and in accordance with an alternative embodiment of the invention, an ESD protection device 110 is similar to the ESD protection device 10 (FIGS.

1-4) but further includes a field-effect transistor 112, an integrated diffusion resistor 114, a ballast resistor 116, and an isolation region 118. Although ESD protection device 110 includes three field-effect transistors 12, 14, 112 in the representative embodiment, it should be understood that additional embodiments of the invention may include ESD protection devices having four or more field-effect transistors connected in series in essentially the same manner as shown in FIG. 8. It should be further understood that embodiments having three or more field-effect transistors might have silicide blocking layers configured similarly to those associated with ESD protection device 80 (FIG. 5); may include additional isolation features similar those associated with ESD protection device 90 (FIG. 6); and/or may rely on the TS process to define integrated diffusion resistors an field-effect transistors similarly to the ESD protection device 100 (FIG. 7).

The isolation region 118 of ESD protection device 110 may define a drain 117 of field-effect transistor 112 that is coupled with the drain 30 of field-effect transistor 14 by the integrated diffusion resistor 114. The drain 117 of field-effect transistor 112 may include a silicide layer 119 and may be electrically coupled with the protected internal circuit 68. The protected internal circuit 68 may thereby be coupled with the second pad 66 through the integrated diffusion resistors 15, 114. The distributed ESD protection provided by the integrated diffusion resistors 15, 114, as well as the field-effect transistors 12, 14, 112 may provide a lower capacitive load to the second pad 66 and protected internal circuit 68 as compared to an ESD protection device using fewer integrated diffusion resistors 15, 114 and/or field-effect transistors 12, 14, 112. The ESD protection device 110 illustrated in FIG. 8 may thereby provide better high frequency performance suitable for protecting high-speed integrated circuits and I/O pads.

The operation of the ESD protection device 110 may be similar to that described with respect to the ESD protection device 10 (FIGS. 1-4). Thus, under non-ESD conditions, the field-effect transistors 12, 14, 112 and associated parasitic bipolar transistors may be in high impedance states so that signals are coupled between the second pad 66 and the protected internal circuit 68 though the integrated diffusion resistors 15, 114 with negligible effects. An ESD event may cause the voltage on the second pad 66 to change significantly relative to the first pad 52, which may cause the field-effect transistors 12, 14, 112 to enter into low impedance states as previously described in detail with respect to FIGS. 1-4. The field-effect transistor 12 may thereby provide a low impedance ESD path between the second pad 66 and the first pad 52, which may shunt at least a portion of the ESD event current away from the second pad 66. Likewise, the field-effect transistors 14, 112 may provide additional low impedance ESD current paths to the first pad 52. The field-effect transistors 14, 112 may thereby shunt additional portions of the ESD event currents away from the protected internal circuit 68. The currents shunted away from the protected internal circuit 68 by the field-effect transistors 14, 112 may pass through the integrated diffusion resistor 15, so that a first voltage drop develops across the integrated diffusion resistor 15. Similarly, the current shunted away from the protected internal circuit 68 by the field-effect transistor 112 may pass through the integrated diffusion resistor 114, so that a second voltage drop develops across the integrated diffusion resistor 114. These first and second voltage drops may collectively reduce the ESD voltage presented to the protected internal circuit 68 as compared to an ESD device or circuit lacking the integrated diffusion resistors 15, 114.

The integrated diffusion resistors 15, 114, as well as the field-effect transistors 12, 14, 112, may each be configured to optimize the overall performance of the ESD protection device 110. By way of example, because the current passing through the integrated diffusion resistor 15 during an ESD event may typically be greater than the current passing through the integrated diffusion resistor 114, the body forming the integrated diffusion resistor 114 may be configured to provide a higher impedance (e.g., may be configured with a longer length or shorter width dimension) than the body forming the integrated diffusion resistor 15. Likewise, the field-effect transistor 12 may be configured to have a higher current handling ability (e.g., a larger gate width) than the field-effect transistors 14, 112.

Figure 9:
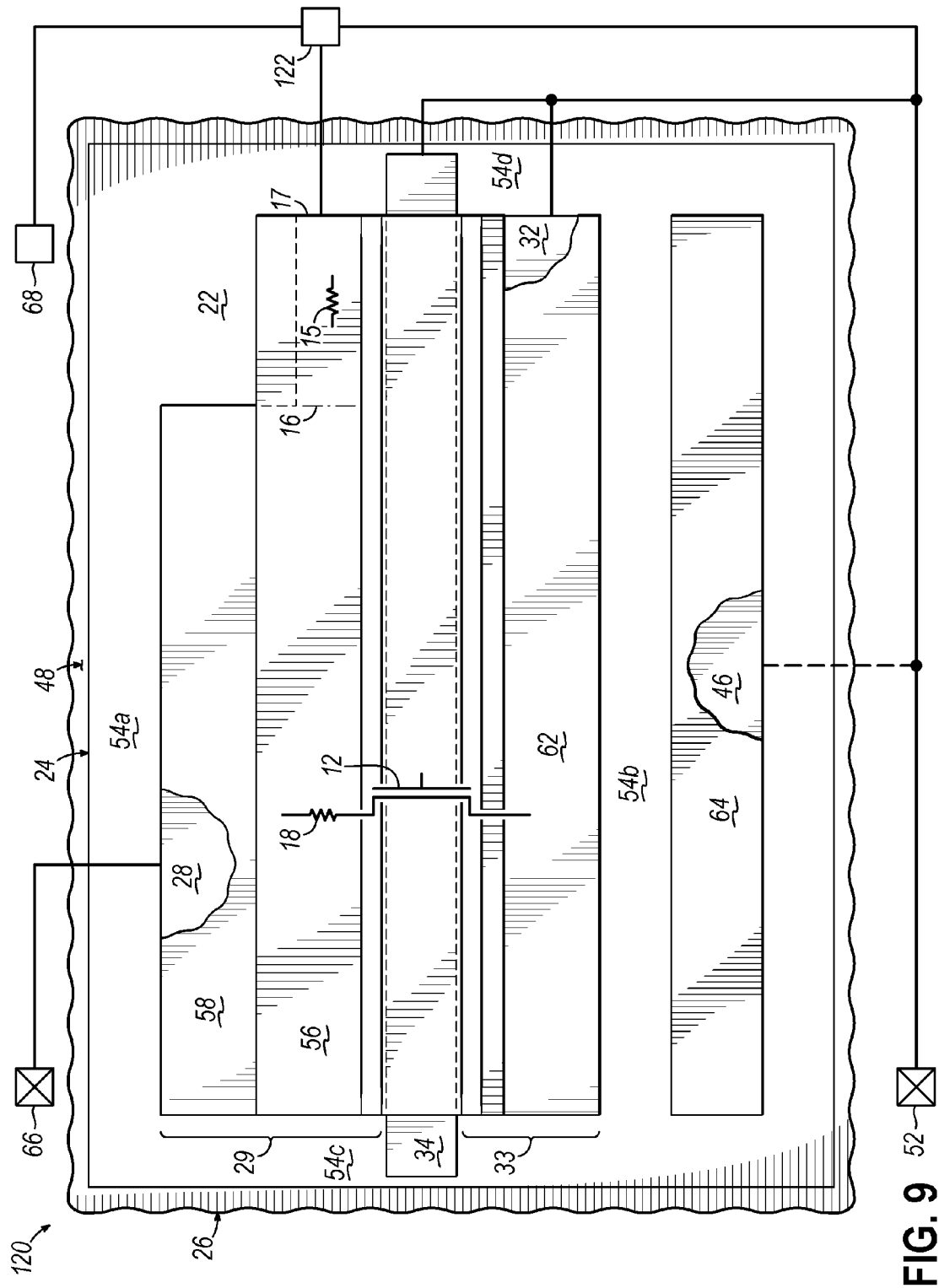
FIG. 9 is a diagrammatic top view of an ESD protection device structure in accordance with an alternative embodiment of the invention.

With reference to FIG. 9 in which like reference numerals refer to like features in FIGS. 1-4 and in accordance with an alternative embodiment of the invention, the ESD protection device 120 is similar to the ESD protection device 10 (FIGS. 1-4) except that the field-effect transistor 14 and associated ballast resistor 20 are omitted. The ESD protection device 120 thus includes a single field-effect transistor serving as a primary ESD device and an integrated diffusion resistor. In operation, the ESD protection device 120 may be coupled with an external or discrete secondary ESD device 122 that is not in the device region 24 of substrate 26. This configuration would allow the use of other devices, such as a diode, for the secondary ESD device 122. The external secondary ESD device 122 might be coupled with the integrated diffusion resistor 15 using local or higher levels of interconnect wiring to allow the secondary ESD device 122 to be located in another region of the chip, such as in close proximity to the protected internal circuit 68. The operation of the ESD protection device 120 illustrated in FIG. 9 is otherwise identical to that previously described in detail with respect to the ESD protection device 10.

Figure 10:
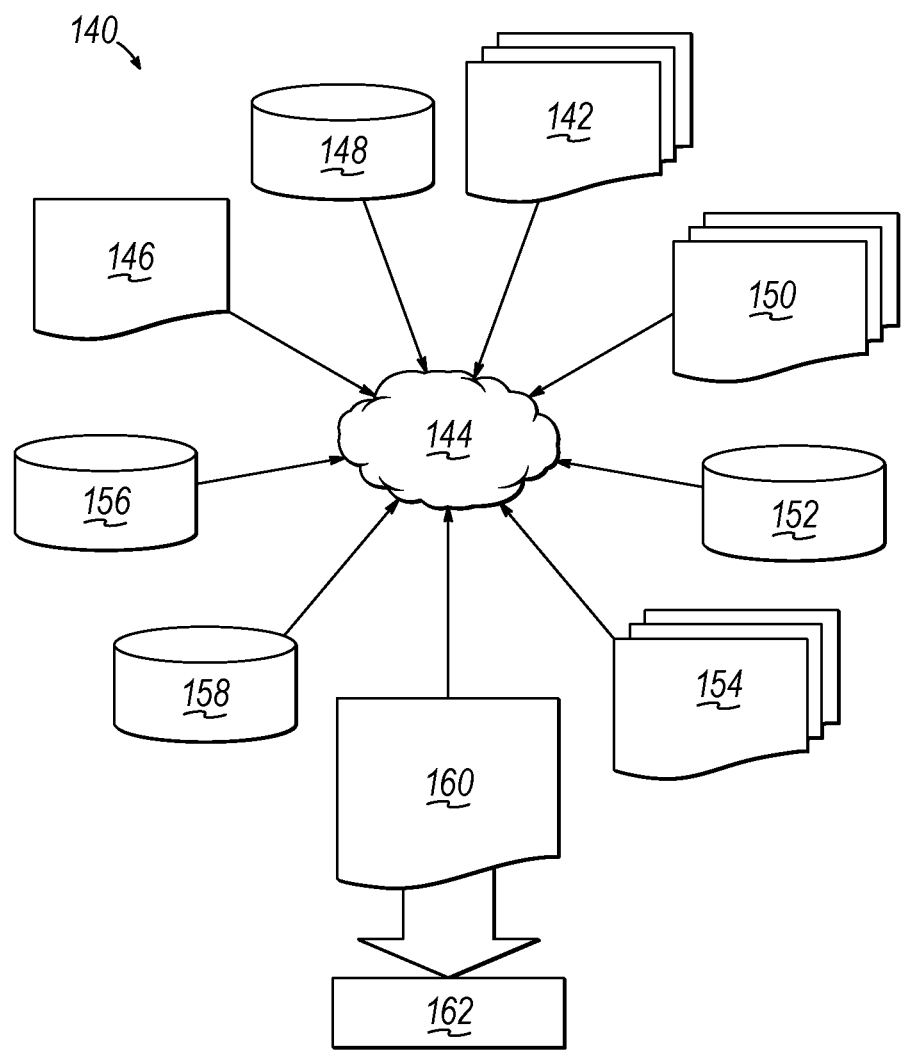
FIG. 10 is a flow diagram of a design process used in semiconductor design, manufacture, and/or test.

FIG. 10 shows a block diagram of an exemplary design flow 140 used for example, in semiconductor IC logic design, simulation, test, layout, and manufacture. Design flow 140 includes processes, machines and/or mechanisms for processing design structures or devices to generate logically or otherwise functionally equivalent representations of the design structures and/or devices described above and shown in FIGS. 1-9. The design structures processed and/or generated by design flow 140 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g., a machine for programming a programmable gate array).

Design flow 140 may vary depending on the type of representation being designed. For example, a design flow 140 for building an application specific IC (ASIC) may differ from a design flow 140 for designing a standard component or from a design flow 140 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 142 that is preferably processed by a design process 144. Design structure 142 may be a logical simulation design structure generated and processed by design process 144 to produce a logically equivalent functional representation of a hardware device. Design structure 142 may also or alternatively comprise data and/or program instructions that when processed by design process 144, generate a functional representation of the physical structure of a hardware device. Whether representing functional and/or structural design features, design structure 142 may be generated using electronic computer-aided design (ECAD) such as implemented by a core developer/designer. When encoded on a machine-readable data transmission, gate array, or storage medium, design structure 142 may be accessed and processed by one or more hardware and/or software modules within design process 144 to simulate or otherwise functionally represent an electronic component, circuit, electronic or logic module, apparatus, device, or system such as those shown in FIGS. 1-9. As such, design structure 142 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 144 preferably employs and incorporates hardware and/or software modules for synthesizing, translating, or otherwise processing a design/simulation functional equivalent of the components, circuits, devices, or logic structures shown in FIGS. 1-9 to generate a netlist 146 which may contain design structures such as design structure 142. Netlist 146 may comprise, for example, compiled or otherwise processed data structures representing a list of wires, discrete components, logic gates, control circuits, I/O devices, models, etc. that describes the connections to other elements and circuits in an integrated circuit design. Netlist 146 may be synthesized using an iterative process in which netlist 146 is resynthesized one or more times depending on design specifications and parameters for the device. As with other design structure types described herein, netlist 146 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 144 may include hardware and software modules for processing a variety of input data structure types including netlist 146. Such data structure types may reside, for example, within library elements 148 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 150, characterization data 152, verification data 154, design rules 156, and test data files 158 which may include input test patterns, output test results, and other testing information. Design process 144 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 144 without deviating from the scope and spirit of the invention. Design process 144 may also include modules for performing standard circuit design processes such as timing analysis, verification, design rule checking, place and route operations, etc.

Design process 144 employs and incorporates logic and physical design tools such as HDL compilers and simulation model build tools to process design structure 142 together with some or all of the depicted supporting data structures along with any additional mechanical design or data (if applicable), to generate a second design structure 160. Design structure 160 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 142, design structure 160 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 160 may comprise a compiled, executable HDL simulation model that functionally simulates the devices shown in FIGS. 1-9.

Design structure 160 may also employ a data format used for the exchange of layout data of integrated circuits and/or symbolic data format (e.g. information stored in a GDSII (GDS2), GL1, OASIS, map files, or any other suitable format for storing such design data structures). Design structure 160 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 160 may then proceed to a stage 162 where, for example, design structure 160: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. The term "lateral" refers to a dimension within the horizontal plane.

It will be understood that when an element is described as being "connected" or "coupled" to or with another element, it can be directly connected or coupled with the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for protecting an integrated circuit from an electrostatic discharge (ESD) event, the device structure comprising:
   a plurality of dielectric regions comprised of a dielectric material and defining an inner perimeter surrounding a device region comprised of a semiconductor material having a first conductivity type;
   a first field-effect transistor including a drain comprised of a first portion of a first doped region in the device region, the first doped region having a second conductivity type opposite to the first conductivity type;
   a first isolation region comprised of the dielectric material and projecting from the inner perimeter of one of the dielectric regions into the first doped region; and
   a diffusion resistor comprised of a second portion of the first doped region that defines a body having a higher electrical resistance than the first portion of the first doped region, the drain of the first field-effect transistor directly coupled with the body of the diffusion resistor,
   wherein the first isolation region narrows a cross-sectional area of the second portion of the first doped region relative to the first portion of the first doped region to form the body of the diffusion resistor.

2. The device structure of claim 1 further comprising:
   a second field-effect transistor with a drain comprising a third portion of the first doped region, the drain of the second field-effect transistor directly coupled with the diffusion resistor so that the body of the diffusion resistor is disposed between the drain of the first field-effect transistor and the drain of the second field-effect transistor, and the third portion of the first doped region having a lower electrical resistance than the second portion of the first doped region.

3. The device structure of claim 2 wherein the first isolation region is laterally positioned in the device region between the first and third portions of the first doped region.

4. The device structure of claim 2 wherein the first field-effect transistor includes a source, the second field-effect transistor includes a source, the source of the first field-effect transistor and the source of the second field-effect transistor collectively comprise a second doped region in the device region, and the second doped region is doped with the second conductivity type.

5. The device structure of claim 2 wherein the first field-effect transistor includes a source comprising a first portion of a second doped region of the device region that is doped with the second conductivity type, the second field-effect transistor includes a source comprising a second portion of the second doped region, and further comprising:
   a second isolation region comprised of a dielectric material and laterally positioned within the device region between the first and second portions of the second doped region.

6. The device structure of claim 2 further comprising:
   a first ballast resistor sharing the first portion of the first doped region with the drain of the first field-effect transistor; and
   a second ballast resistor sharing the third portion of the first doped region with the drain of the second field-effect transistor,
   wherein the first field-effect transistor includes a channel coupled by the first ballast resistor with the drain of the first field-effect transistor and the second field-effect transistor includes a channel coupled by the second ballast resistor with the drain of the second field-effect transistor.

7. The device structure of claim 1 wherein the device region has a top surface, and a surface area on the top surface laterally positioned in vertical alignment with the second portion of the first doped region is free of silicide.

8. The device structure of claim 1 wherein the device region has a top surface, and further comprising:
   a silicide blocking layer on the top surface of the device region, the silicide blocking layer including a first portion laterally positioned on the top surface in vertical alignment with the diffusion resistor.

9. The device structure of claim 8 further comprising:
   a silicide layer having a first portion laterally positioned on the top surface of the device region in vertical alignment with the drain of the first field-effect transistor.

10. The device structure of claim 9 wherein the first field-effect transistor includes a gate on the top surface of the device region, the silicide layer has a second portion laterally positioned on the top surface of the device region in vertical alignment with the gate, and the silicide blocking layer is laterally positioned on the top surface of the device region between the first and second portions of the silicide layer.

11. The device structure of claim 8 wherein the first field-effect transistor includes a gate disposed on the top surface of the device region and a channel in the device region beneath the gate, and further comprising:
   a ballast resistor comprised of a third portion of the first doped region that is laterally positioned on the top surface of the device region in vertical alignment with a second portion of the silicide blocking layer, the ballast resistor positioned between the drain of the first field-effect transistor and the channel of the first field-effect transistor.

12. The device structure of claim 1 further comprising:
an input/output pad coupled with the drain of the first field-effect transistor; and
a secondary ESD device coupled by the diffusion resistor with the drain of the first field-effect transistor.

13. The device structure of claim 1 wherein the first field-effect transistor includes a gate disposed on a top surface of the device region and a channel in the device region beneath the gate, and further comprising:
a ballast resistor comprised of a third portion of the first doped region that is laterally positioned between the drain of the first field-effect transistor and the channel of the first field-effect transistor.

14. A method of fabricating a device structure for protecting an integrated circuit from an electrostatic discharge (ESD) event, the method comprising:
forming a device region comprised of a semiconductor material having a first conductivity type;
forming a first doped region in the device region that has a second conductivity type opposite to the first conductivity type and that includes a drain of a first field-effect transistor as a first portion; and
narrowing a cross-sectional area of a second portion of the first doped region relative to a cross-sectional area of the first portion of the first doped region to form a body of a diffusion resistor,
wherein the body of the diffusion resistor is directly coupled with the drain of the first field-effect transistor and has a higher electrical resistance than the drain of the first field-effect transistor.

15. The method of claim 14 wherein narrowing the cross-sectional area of the second portion of the first doped region relative to the second portion of the first doped region comprises:
forming a plurality of dielectric regions comprised of a dielectric material and defining an inner perimeter surrounding the device region; and
when forming the dielectric regions, concurrently forming an isolation region comprised of the dielectric material and projecting from the inner perimeter of the dielectric regions into the first doped region at a location of the body of the diffusion resistor.

16. The method of claim 14 wherein the device region has a top surface, and comprising:
forming a silicide layer on a first surface area of the top surface that is laterally positioned on the top surface in vertical alignment with the first portion of the first doped region; and
before the silicide layer is formed, forming a silicide-blocking layer on a second surface area of the top surface that is laterally positioned on the top surface in vertical alignment with the second portion of the first doped region.

17. The method of claim 14 wherein the device region has a top surface, and comprising:
forming a hardmask on the top surface of the device region;
patterning the hardmask to expose a first surface area of the top surface that is laterally positioned on the top surface in vertical alignment with the first portion of the first doped region while masking a second surface area of the top surface that is laterally positioned on the top surface in vertical alignment with the second portion of the first doped region.

18. The method of claim 14 further comprising:
forming an input/output pad coupled with the drain of the first field-effect transistor; and
forming a secondary ESD device coupled with the body of the diffusion resistor.

19. The method of claim 14 wherein a third portion of the first doped region comprises a drain of a second field-effect transistor directly coupled with the diffusion resistor so that the body of the diffusion resistor is disposed between the drain of the first field-effect transistor and the drain of the second field-effect transistor, and the third portion of the first doped region having a lower electrical resistance than the second portion of the first doped region.

20. The method of claim 19 wherein the isolation region is laterally positioned in the device region between the first and third portions of the first doped region.

21. The method of claim 19 further comprising:
forming a second doped region in the device region that is doped with the second conductivity type and that includes a source of the first field-effect transistor and a source of the second field-effect transistor.

22. The method of claim 14 wherein the first field-effect transistor includes a gate disposed on a top surface of the device region and a channel in the device region beneath the gate, and the first doped region includes a third portion that is laterally positioned as a ballast resistor between the drain of the first field-effect transistor and the channel of the first field-effect transistor.

23. A hardware description language (HDL) design structure encoded on a machine-readable data storage medium, the HDL design structure comprising elements that when processed in a computer-aided design system generates a machine-executable representation of a device structure for protecting an integrated circuit during an electrostatic discharge (ESD) event, the HDL design structure comprising:
a plurality of dielectric regions comprised of a dielectric material and defining an inner perimeter surrounding a device region comprised of a semiconductor material having a first conductivity type;
a field-effect transistor including a drain comprised of a first portion of a doped region in the device region, the doped region having a second conductivity type opposite to the first conductivity type;
a first isolation region comprised of the dielectric material and projecting from the inner perimeter of one of the dielectric regions into the doped region; and
a diffusion resistor comprised of a second portion of the doped region that defines a body having a higher electrical resistance than the first portion of the doped region, the drain of the field-effect transistor directly coupled with the body of the diffusion resistor,
wherein the first isolation region narrows a cross-sectional area of the second portion of the first doped region relative to the first portion of the first doped region to form the body of the diffusion resistor.

24. The HDL design structure of claim 23 wherein the HDL design structure comprises a netlist.

25. The HDL design structure of claim 23 wherein the DHL design structure resides on storage medium as a data format used for the exchange of layout data of integrated circuits.

26. The HDL design structure of claim 23 wherein the HDL design structure resides in a programmable gate array.

* * * * *